(12) United States Patent
Griswold et al.

(10) Patent No.: US 11,841,413 B2
(45) Date of Patent: Dec. 12, 2023

(54) SYSTEM AND METHOD FOR B1-SELECTIVE SPATIAL ENCODING USING MAGNETIC RESONANCE

(71) Applicants: Case Western Reserve University, Cleveland, OH (US); Vanderbilt University, Nashville, TN (US)

(72) Inventors: Mark A. Griswold, Shaker Heights, OH (US); William A. Grissom, Nashville, TN (US)

(73) Assignees: Case Western Reserve University, Cleveland, OH (US); Vanderbilt University, Nashville, TN (US)

( * ) Notice: Subject to any disclaimer, the term of this patent is extended or adjusted under 35 U.S.C. 154(b) by 0 days.

(21) Appl. No.: 17/758,138

(22) PCT Filed: Dec. 30, 2020

(86) PCT No.: PCT/US2020/067582
§ 371 (c)(1),
(2) Date: Jun. 29, 2022

(87) PCT Pub. No.: WO2021/138504
PCT Pub. Date: Jul. 8, 2021

(65) Prior Publication Data
US 2023/0039004 A1    Feb. 9, 2023

Related U.S. Application Data

(60) Provisional application No. 62/966,749, filed on Jan. 28, 2020, provisional application No. 62/955,410, filed on Dec. 30, 2019.

(51) Int. Cl.
*G01R 33/565* (2006.01)
*G01R 33/483* (2006.01)

(52) U.S. Cl.
CPC ... *G01R 33/56554* (2013.01); *G01R 33/4831* (2013.01); *G01R 33/4833* (2013.01)

(58) Field of Classification Search
CPC .......... G01R 33/56554; G01R 33/4831; G01R 33/4833; G01R 33/50
(Continued)

(56) References Cited

U.S. PATENT DOCUMENTS

| 2010/0016708 A1 | 1/2010 | Katscher et al. | |
| 2012/0146637 A1* | 6/2012 | Zhu | G01R 33/48 324/307 |

(Continued)

OTHER PUBLICATIONS

Lee, Daeho, et al. "Verse-guided numerical RF pulse design: a fast method for peak RF power control." Magnetic resonance in medicine 67.2 (2012): 353-362. (Year: 2012).*

(Continued)

*Primary Examiner* — Christopher P McAndrew
(74) *Attorney, Agent, or Firm* — Quarles & Brady LLP

(57) ABSTRACT

The present application provides a system and method for using a nuclear magnetic resonance (NMR) system. The method includes performing a pulse sequence using the NMR system that spatially encodes NMR signal evolutions to be acquired from a subject using an aggregated radio-frequency (B1) field incoherence and resolving the NMR signal evolutions acquired from the subject using at least one of a dictionary of known magnetic resonance fingerprinting (MRF) signal evolutions to determine matches in the NMR signal evolutions to the known MRF signal evolutions or an optimization process. The method also includes generating at least two spatially-resolved measurements indicating quantitative tissue parameters of the subject in at least two locations.

22 Claims, 6 Drawing Sheets

(58) Field of Classification Search
USPC .......................................................... 324/309
See application file for complete search history.

(56) References Cited

U.S. PATENT DOCUMENTS

| | | | | |
|---|---|---|---|---|
| 2015/0253403 | A1* | 9/2015 | Grissom | G01R 33/4831 |
| | | | | 324/309 |
| 2015/0302297 | A1* | 10/2015 | Griswold | G06N 3/08 |
| | | | | 706/23 |
| 2016/0041249 | A1* | 2/2016 | Lee | G01R 33/4818 |
| | | | | 324/309 |
| 2018/0238982 | A1* | 8/2018 | Grodzki | G01R 33/543 |
| 2019/0227134 | A1* | 7/2019 | Taniguchi | G06T 11/008 |
| 2020/0371184 | A1* | 11/2020 | Ye | G01R 33/5659 |

OTHER PUBLICATIONS

Anderson, Christian Edwin. High-Field Magnetic Resonance Fingerprinting for Molecular MRI. Case Western Reserve University, 2018. (Year: 2018).*

Anderson, Christian Edwin. High-Field Magnetic Resonance Fingerprinting for Molecular MRI. Case Western Reserve University, 2018.

Cunningham, Charles H., and Michael L. Wood. "Method for improved multiband excitation profiles using the Shinnar-Le Roux transform." Magnetic Resonance in Medicine: An Official Journal of the International Society for Magnetic Resonance in Medicine 42.3 (1999): 577-584.

Canet, Daniel. "Radiofrequency field gradient experiments." Progress in Nuclear Magnetic Resonance Spectroscopy 30.1-2 (1997): 101-135.

Grissom, William A., Zhipeng Cao, and Mark D. Does. "|B1+|-selective excitation pulse design using the Shinnar-Le Roux algorithm." Journal of Magnetic Resonance 242 (2014): 189-196.

Gudino, Natalia, et al. "On-coil multiple channel transmit system based on class-D amplification and pre-amplification with current amplitude feedback." Magnetic resonance in medicine 70.1 (2013): 276-289.

Hoult, D. I. "Rotating frame zeugmatography." Journal of Magnetic Resonance (1969) 33.1 (1979): 183-197.

Katscher, Ulrich, Jonathan Lisinski, and Peter Börnert. "RF encoding using a multielement parallel transmit system." Magnetic Resonance in Medicine: An Official Journal of the International Society for Magnetic Resonance in Medicine 63.6 (2010): 1463-1470.

Lee, Daeho, et al. "Verse-guided numerical RF pulse design: a fast method for peak RF power control." Magnetic resonance in medicine 67.2 (2012): 353-362.

Ma, Dan, et al. "Magnetic resonance fingerprinting." Nature 495. 7440 (2013): 187-192.

Moore, Jason E. Radio frequency pulse designs for magnetic resonance imaging at high field. Vanderbilt University, 2011. (1-335).

Sharp, Jonathan C., and Scott B. King. "MRI using radiofrequency magnetic field phase gradients." Magnetic Resonance in Medicine: An Official Journal of the International Society for Magnetic Resonance in Medicine 63.1 (2010): 151-161.

Trakic, Adnan, et al. "Model for imaging in MRI using the rotating RF field." Computational and Mathematical Methods in Medicine 2014 (2014).

International Search Report from PCT/US2022/067582 dated Mar. 25, 2021.

* cited by examiner

Hard Pulse

Hadamard Pulse

SYSTEM AND METHOD FOR B1-SELECTIVE SPATIAL ENCODING USING MAGNETIC RESONANCE

CROSS-REFERENCE TO RELATED APPLICATIONS

This application represents the national stage entry of PCT/US2020/067582, filed on Dec. 30, 2020, which is supported by, based on, and incorporates herein by reference in their entireties U.S. Provisional Application Ser. No. 62/955,410, filed Dec. 30, 2019, and U.S. Provisional Application Ser. No. 62/966,749, filed Jan. 28, 2020.

STATEMENT REGARDING FEDERALLY SPONSORED RESEARCH OR DEVELOPMENT

N/A

BACKGROUND

The present disclosure relates generally to systems and methods for nuclear magnetic resonance (NMR) techniques and processes and, more particularly, systems and methods for magnetic resonance fingerprinting (MRF) using pulse sequences that achieve spatial encoding using radio frequency (RF) (B1) fields and, thereby, without the need for B0 gradients.

When human tissue or other substance is subjected to a uniform magnetic field (polarizing field B0), the individual magnetic moments of the nuclei in the tissue attempt to align with the polarizing field, and precess about it in random order at their characteristic Larmor frequency. If the tissue, or substance, is subjected to a magnetic field (excitation field B1) that is in the x-y plane and near the Larmor frequency, the net aligned moment, $M_z$, may be rotated, or "tipped", into the x-y plane to produce a net transverse magnetic moment $M_{xy}$. A nuclear magnetic resonance (NMR) or magnetic resonance (MR) signal is emitted by the excited nuclei or "spins", after the excitation signal B1 is terminated, and the signal may be received and processed to form an image.

When utilizing MR signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using various reconstruction techniques.

The B0 gradients are produced by dedicated gradient coils that produce linear gradients applied over the B0 field to enable spatial encoding of the MR signals. However, dedicated B0 gradient systems are costly to manufacture and are bulky. Furthermore, these dedicated B0 gradient systems lead to patient discomfort via acoustic noise and peripheral nerve stimulation.

As such, a few spatial encoding methods have been proposed that use RF coils to produce the gradients relative to the B0 field to spatially encode the MR signals in a manner that is consistent with that typically performed with gradient coils. These RF-gradients techniques do not suffer from the above drawbacks of dedicated gradient coil systems, such as the noise created by dedicated gradient systems or the peripheral nerve stimulation that some experience. Unfortunately, these techniques for using RF coils to apply gradients require linear RF amplitude, which is challenging to implement, or phase gradient coils, which necessitates specialized hardware. Further still, these systems and methods that attempt to use RF coils to apply spatial encoding gradients to the MR signals often result in insufficient encoding, which degrades image quality.

Therefore, there is a need for new techniques for improved systems and methods for acquiring and processing MR or NMR signals.

SUMMARY

The present disclosure overcomes the drawbacks of previous technologies by providing systems and methods for acquiring and processing NMR data without the need for dedicated B0 gradient coils or systems and their documented drawbacks. More particular, a system and method is provided for B0 gradient-free NMR or MRI data acquisition that uses non-uniform RF gradients for spatial encoding of the NMR data. As one non-limiting example, the systems and method provided herein may use B1-selective parallel transmission techniques for spatial encoding of the acquired data. By using non-linear RF magnitude gradients synthesized by an array of conventional transmit coils, combined with B1+-selective encoding pulses, the need for B0 gradients is removed, along with the extensive drawbacks for B0 gradient coil systems, such as noise, cost, bulk, and peripheral nerve stimulation.

In accordance with one aspect of the present disclosure, a method is provided for using a nuclear magnetic resonance (NMR) system. The method includes performing a pulse sequence using the NMR system that spatially encodes NMR signal evolutions to be acquired from a subject using an aggregated radio-frequency (B1) field incoherence and resolving the NMR signal evolutions acquired from the subject using at least one of a dictionary of known magnetic resonance fingerprinting (MRF) signal evolutions to determine matches in the NMR signal evolutions to the known MRF signal evolutions or an optimization process. The method also includes generating at least two spatially-resolved measurements of quantitative tissue parameters of the subject.

In accordance with another aspect of the present disclosure, a magnetic resonance imaging (MRI) system is provided. The system includes a magnet system configured to generate a polarizing magnetic field about a portion of the subject positioned in the MRI system and a radio frequency (RF) system configured to apply a RF excitation field to the subject and acquire therefrom a set of magnetic resonance image (MRI) data. The system also includes at least one processor configured to control the RF system to perform a pulse sequence that spatially encodes MRI signal evolutions to be acquired from a subject using a radio-frequency (B1) field and without needing B0 gradient coils configured to apply a gradient field to the polarizing magnetic field. The processor is further configured to resolve the MRI signal evolutions acquired from the subject using at least one of a dictionary of known magnetic resonance fingerprinting (MRF) signal evolutions to determine matches in the MRI signal evolutions to the known MRF signal evolutions or an optimization to determine tissue parameters and spatial resolution from the MRI signal evolutions and generate a report indicating quantitative parameters of the subject in at least two a spatially-resolved locations forming a map.

In accordance with yet another aspect of the present disclosure, a method is provided for generating images or maps of a subject using a nuclear magnetic resonance (NMR) system. The method includes performing a pulse sequence only using a radio-frequency (B1) field that excites NMR signal evolutions that are spatially incoherent and tissue-parameter incoherent, and acquiring the NMR signal evolutions that are that are spatially incoherent and tissue-parameter incoherent from the subject. The method also includes resolving the NMR signal evolutions using at least one of a dictionary of known magnetic resonance fingerprinting (MRF) signal evolutions to determine matches in the NMR signal evolutions to the known MRF signal evolutions or an optimization process to generate resolved tissue parameters and spatially-resolved signal evolutions, and generating at least one of an image or a spatially-resolved map indicating the tissue parameters of the subject in at least two locations using the resolved tissue parameters and spatially-resolved signal evolutions.

DETAILED DESCRIPTION

Figure 1:
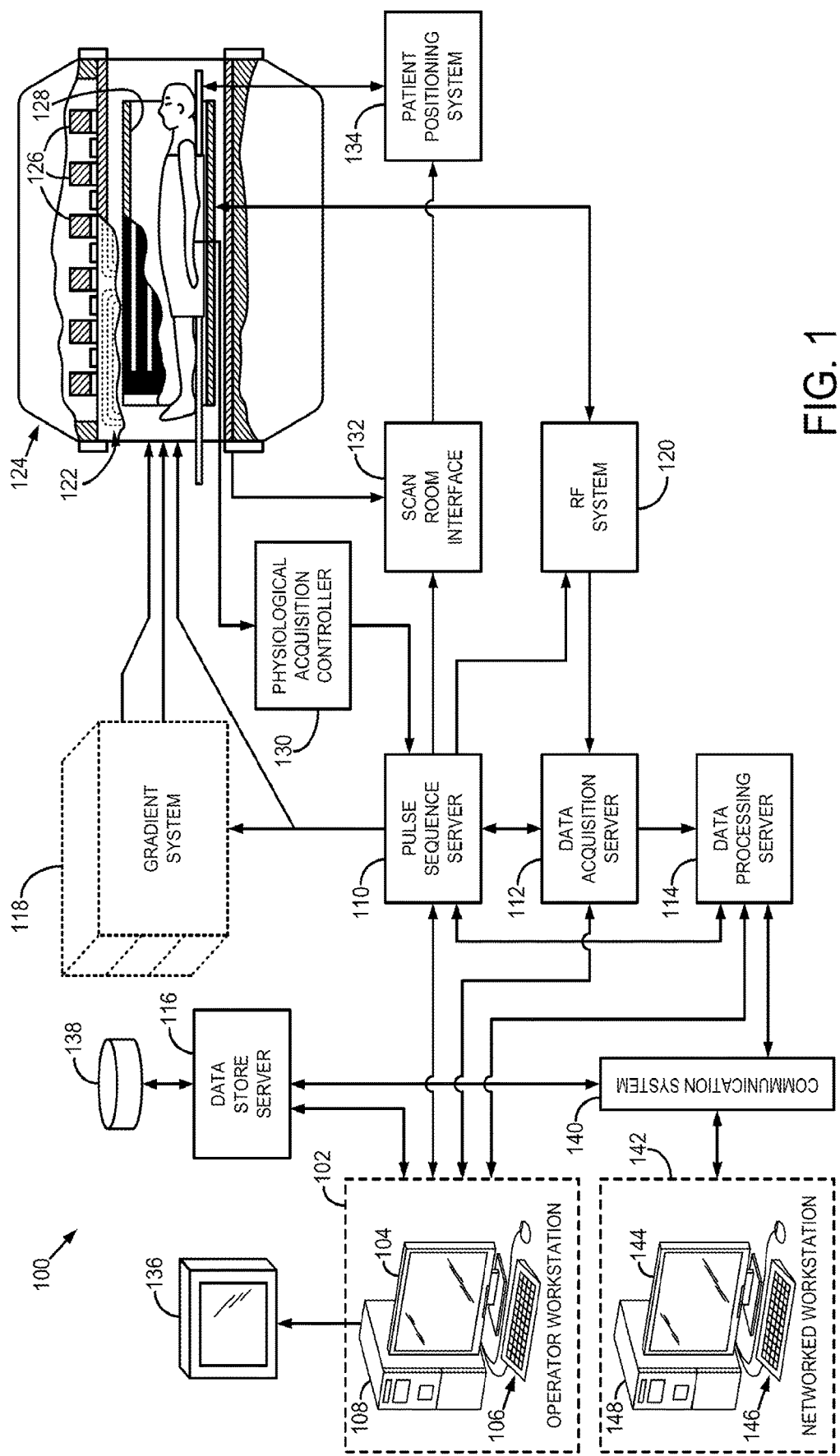
FIG. 1 is a schematic diagram of an example magnetic resonance imaging (MRI) system, in accordance with aspects of the present disclosure.

Referring to FIG. 1 a magnetic resonance imaging (MRI) system 100 in accordance with the present disclosure is illustrated. The MRI system 100 includes an operator workstation 102, which will typically include a display 104, one or more input devices 106 (such as a keyboard and mouse or the like), and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to multiple servers, including a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a radiofrequency (RF) system 120. Notably, the traditional gradient system 118 is indicated as optional because, using the systems and method described herein, the gradient system 118 may be entirely omitted or may be an optional system that is not generally needed. Correspondingly, a gradient coils assembly 122 to produce the magnetic field gradients $G_x$, $G_y$, $G_z$ for position encoding magnetic resonance signals is likewise optional. Thus, the gradient coil assembly 122 may form part of a magnet assembly 124 that includes a polarizing magnet 126 and a whole-body RF coil 128, or the gradient coil assembly 122 may be omitted entirely and the RF system 120 and associated components may be utilized for spatial encoding, which substantially reduces the size, cost, and complexity of the MRI system 100.

That is, as will be described, the present disclosure provides systems and methods for utilizing the RF system 120 to perform spatial encoding that is traditionally performed with the gradient system 118 and associated components. In one non-limiting example, B1-selective parallel transmission techniques may be used for spatial encoding of the acquired data. RF waveforms can be applied by the RF system 120 to the RF coil 128, or a separate local coil (not shown in FIG. 1), in order to perform the prescribed magnetic resonance pulse sequence.

Responsive magnetic resonance signals detected by the RF coil 128, or a separate local coil, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 includes multiple RF transmit channels and may include multiple receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = I^2 + Q^2 \qquad \text{Eqn. 1;}$$

and the phase of the received magnetic resonance signal may also be determined according to the following relationship:

$$\varphi = \tan^{-1}\left(\frac{Q}{I}\right). \qquad \text{Eqn. 2}$$

The pulse sequence server 110 also optionally receives patient data from a physiological acquisition controller 130. By way of example, the physiological acquisition controller 130 may receive signals from a number of different sensors connected to the patient, such as electrocardiograph (ECG) signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120, or to control the view order in which k-space is sampled. In still another example, the data acquisition server 112 may also be employed to process magnetic resonance signals used to detect the arrival of a contrast agent in a magnetic resonance angiography (MRA) scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction techniques, such as iterative or backprojection reconstruction techniques; applying filters to raw k-space data or to reconstructed images; generating functional magnetic resonance images; calculating motion or flow images; resolving MRF signal evolutions to reconstruct quantitative reports that include spatially-resolved measurements, maps, or images, and so on.

Images or reports reconstructed by the data processing server 114 are conveyed back to the operator workstation 102. Images or reports may be output to operator display 112 or a display 136 that is located near the magnet assembly 124 for use by attending clinician. Batch mode images or selected real-time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The data processing server 114 may also be configured to reconstruct an image of the subject or generate a report about the subject. To this end, the data processing server 114 may include various computing capabilities, including various general-purpose processors, as well as various dedicated processing modules or logic (not shown in FIG. 1). For example, the data processing server 114 may include a module or logic that is configured to resolve the acquired MRF data. In one non-limiting example, the data processing server 114 may include a dictionary generating module or logic that is configured to access a dictionary of signal evolutions or MRF data. Other modules or logic for carrying out specific functions, as described herein, may also be possible. To this end, the data processing server 114 may be configured to access and retrieve data stored in a memory or other data storage location. Alternatively, instead of performing a dictionary comparison, the data processing server 114 may be configured to perform an optimization process to determine tissue parameters at each voxel. In this regard, "resolving" signal evolutions or MRF data may include comparing to reference signals or may include other processing techniques. Resolving MRF data or signal evolutions may be performed in various ways including, but not limited to, pattern matching, selection, minimization of a cost function, and optimization. Pattern matching may include, but is not limited to, orthogonal matching pursuit (OMP), categorical sequence labeling, regression, clustering, classification, real value sequence labeling, parsing algorithms, Bayesian methods, Markov methods, ensemble learning methods, and template matching. Optimization may include, but is not limited to, least squares optimization, regularized least squares optimization, basis pursuit optimization, and matching pursuit optimization. An optimization or matching process may be implemented using computer systems, including software algorithms, machine learning, or artificial intelligence, including neural networks.

The MRI system 100 may also include one or more networked workstations 142. By way of example, a networked workstation 142 may include a display 144, one or more input devices 146 (such as a keyboard and mouse or the like), and a processor 148. The networked workstation 142 may be located within the same facility as the operator workstation 102, or in a different facility, such as a different healthcare institution or clinic. The networked workstation 142 may include a mobile device, including phones or tablets.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may exchanged between the data processing server 114 or the data store server 116 and the networked workstations 142, such that the data or images may be remotely processed by a networked workstation 142. This data may be exchanged in any suitable format, such as in accordance with the transmission control protocol (TCP), the internet protocol (IP), or other known or suitable protocols.

The above-described systems may be used to perform magnetic resonance fingerprinting (MRF) techniques that are capable of acquiring clinically-useful quantitative images or maps of a subject without relying on traditional magnetic field gradients. That is, as will be described, systems and methods are provided for acquiring and processing NMR data using non-linear RF gradients for spatial encoding of the NMR data and, thereby, without the need for dedicated B0 gradient coils or systems and their documented drawbacks. This is an appreciable improvement over prior MRI- and NMR-based systems and has particular utility on MRF.

MRF is a technique that facilitates mapping of tissue or other material properties based on signal evolutions elicited from the subject or object being imaged. MRF can be used to produce maps or images. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when RF energy is applied to a volume that has both bone and muscle tissue, then both the bone and muscle tissue will produce a NMR signal; however, the "bone signal" represents a first resonant species and the "muscle signal" represents a second resonant species, and thus the two signals will be different. These different signals from different species can be collected simultaneously over a period of time to collect an overall "signal evolution" for each voxel in the volume. As described herein, the RF energy can be used to both elicit the signal evolutions and to spatially encode the acquired signal evolutions.

The signal evolutions obtained in MRF techniques are achieved by varying the acquisition parameters from one repetition time (TR) period to the next, which creates a time series of signals with varying contrast. Examples of acquisition parameters that can be varied include flip angle (FA), RF pulse phase, TR, echo time (TE), and sampling patterns, such as by modifying one or more readout encoding gradients. The acquisition parameters can be varied so as to elicit signal evolutions that, in the context of MRI would be unusable. Specifically, the acquisition parameters are varied in a random manner, pseudorandom manner, or other manner that results in signals from different materials or tissues to be spatially incoherent, temporally incoherent, or both. For example, in some instances, the acquisition parameters can be varied according to a random or pseudorandom, or in non-random or non-pseudorandom patterns, that results in signals from different materials or tissues to be spatially incoherent, temporally incoherent, or both.

From these signal evolutions, which as mentioned above may appear to be elicited using random or pseudorandom variations in acquisition parameters, or may contain signals from different materials or tissues that are spatially incoherent, temporally incoherent, or both, MRF processes can be designed to map any of a wide variety of parameters. Examples of such parameters that can be mapped may include, but are not limited to, longitudinal relaxation time ($T_1$), transverse relaxation time ($T_2$), main or static magnetic field map ($B_0$), and proton density ($\rho$). MRF is generally described in U.S. Pat. No. 8,723,518 and Published U.S. Patent Application No. 2015/0301141, each of which is incorporated herein by reference in its entirety for all purposes. As used herein, a map may be a report that is spatially resolved for at least two locations. These locations may be spatially resolved as two pixels or voxels. Thus, a map may include at least two-spatially resolved pixels or voxels, which may be quantitatively or qualitatively resolved for any of a variety of tissue parameters, such as described above or follows further below.

To characterize the different materials, or tissues, or spin species, these signal evolutions are resolved. As described above, this may be done with a dictionary of signal models, or templates, for example, which may have been generated for different acquisition parameters from magnetic resonance signal models, such as Bloch equation-based physics simulations. This comparison allows for the estimation of the physical parameters, such as those mentioned above. As an example, the comparison of the acquired signal evolutions to a dictionary can be performed using a suitable matching or pattern recognition technique. The constituent materials properties for the tissue or other material in a given voxel can be estimated to be the values that provide the best signal matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps. Alternatively, as described, resolving the signal evolutions may be performed using an optimization.

The acquired signal evolutions and information derived from reference signal evolutions may be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0; \quad \text{Eqn. 3}$$

where SE is a signal evolution; $N_S$ is a number of spins; $N_A$ is a number of sequence blocks; $N_{RF}$ is a number of RF pulses in a sequence block; $\alpha$ is a flip angle; $\phi$ is a phase angle; $R_i(\alpha)$ is a rotation due to off resonance; $R_{RF_{ij}}(\alpha,\phi)$ is a rotation due to RF differences; $R(G)$ is a rotation due to a magnetic field gradient; $T_1$ is a longitudinal, or spin-lattice, relaxation time; $T_2$ is a transverse, or spin-spin, relaxation time; D is diffusion relaxation; $E_i$ ($T_1$, $T_2$, D) is a signal decay due to relaxation differences; and $M_0$ is the magnetization in the default or natural alignment to which spins align when placed in the main magnetic field. As will be described, due to the RF gradients and B1+ selective pulses, the various flip angles and phase angles are selected to be spatially varying, so that different spatial locations undergo different and, generally, unique sequences that create incoherence not only between different tissue types but also between different spatial locations. As used herein B1-selective may refer to the combination of a B1-selective pulse with a B1-inhomogeneity. Put another way, an aggregated B1 field incoherence may refer to a B1 field that includes inhomogeneities and two distinct RF excitation pulses with different spatial distributions or the same RF excitation pulses applied with respect to differing B1 field inhomogeneities. The sequence is then extended with additional sequence blocks to produce that additional dimension of incoherence for spatial encoding in the signal evolutions. Thus, in general, the RF system of the MRI system is controlled to vary the excitation pulses and/or the B1 field inhomogeneities spatially to create spatial incoherence that serves to spatially encode the acquired signal evolutions, in addition to the incoherence attributable to the constituent materials or tissues of the subject.

While $E_i(T_1, T_2, D)$ is provided as an example, in different situations, the decay term, $E_i(T_1, T_2, D)$, may also include additional terms, $E_i(T_1, T_2, D, \ldots)$ or may include fewer terms, such as by not including the diffusion relaxation, as $E_i(T_1, T_2)$ or $E_i(T_1, T_2, \ldots)$. Also, the summation on "j" could be replace by a product on "j".

The dictionary may store signals described by:

$$S_i = R_i E_i (S_{i-1}) \quad \text{Eqn. 4;}$$

where $S_0$ is the default, or equilibrium, magnetization; $S_i$ is a vector that represents the different components of magnetization, $M_x$, $M_y$, and $M_z$ during the $i^{th}$ acquisition block; $R_i$ is a combination of rotational effects that occur during the $i^{th}$ acquisition block; and $E_i$ is a combination of effects that alter the amount of magnetization in the different states for the $i^{th}$ acquisition block. In this situation, the signal at the $i^{th}$ acquisition block is a function of the previous signal at acquisition block (i.e., the $(i-1)^{th}$ acquisition block). Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks. Additionally or alternatively, an optimization process may be used to resolve the signal evolutions. Regardless of dictionary matching, optimization, or a combination thereof, the process must resolve along an additional dimension beyond resolving tissue properties. That is, the process is designed to resolve both tissue properties and two or more spatial locations using the information represented by the acquired signal evolutions. As a non-limiting example, the parameters that are resolved may include $M_0, B_0, B_1, T_1, T_2$, diffusion weighting, proton density, and many others. As combined with the ability to resolve the parameters spatially, the present disclosure can, thus, provide spatially-resolved reports regarding one or more of these parameters. That is, parameter maps or images may be created that communicate the parameters with spatial resolution.

Figure 2:
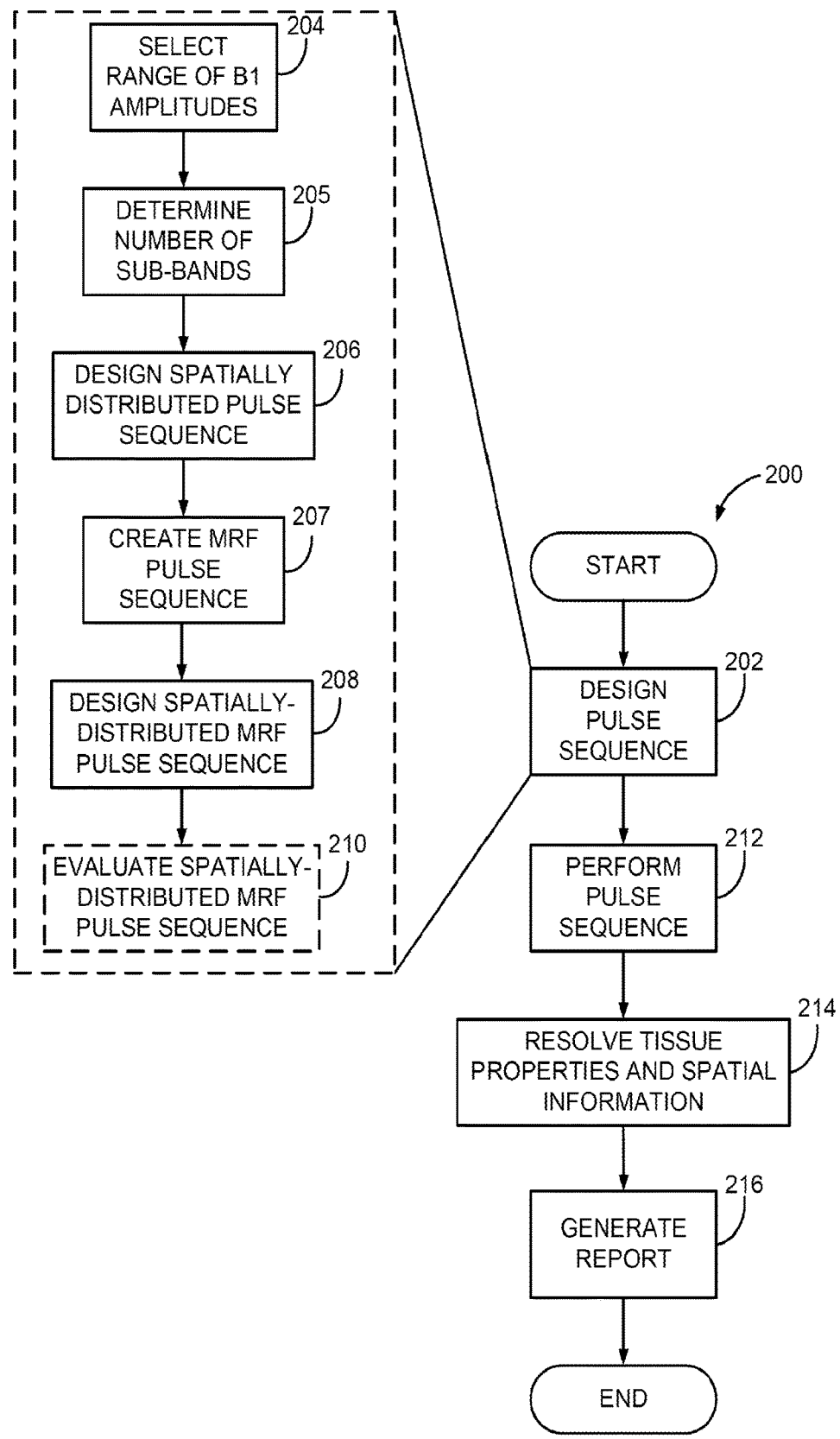
FIG. 2 is a flow chart setting forth a process in accordance with the present disclosure for acquiring NMR data without using dedicated magnetic field gradient coil systems for spatial encoding.

Referring now to FIG. 2, the above-described systems and methods can be used to design and utilize pulse sequences for MRF, whereby a B1, RF field is used achieve spatial encoding. In one non-limiting, example, as will be described, the pulse sequence may be designed to utilize B1+-selective pulses to effectuate both spatial encoding and readout. One example of a process 200 in accordance with the present disclosure begins at step 202 with a pulse sequence design process.

In one, non-limiting example, a process for designing the pulse sequence 202 uses B1-selective parallel transmission techniques for spatial encoding of the acquired data. By using non-linear RF magnitude gradients synthesized by an array of transmit coils, combined with B1+-selective encoding pulses, the need for B0 gradients is removed, along with the extensive drawbacks for B0 gradient coil systems, such as noise, cost, bulk, and peripheral nerve stimulation.

In one non-limiting example, designing the pulse sequence begins by selecting a range of B1 amplitudes to encode across the coil array at step 204. A given pulse's modulation waveform can be directly designed, and its amplitude and sign modulation waveform used to take the place of the gradient field. For example, one default range of B1 amplitudes may be selected to match a range of B1 amplitudes produced by the parallel transmit coil array. At process block 205, the process continues by selecting the number of sub-bands within the selected range to encode with the B1-selective pulses. In this case, the number of sub-bands may be selected based on the desired spatial resolution and performing a point-spread function analysis. At process block 206, the process continues by designing a set of N-bands B1-selective pulses using the selected range of B1 amplitudes and number of side bands selected.

That is, pulse design may use an algorithm based on a rotated Shinnar-Le Roux pulse design algorithm, wherein the pulse's frequency modulation waveform is directly designed by the algorithm, and its amplitude and sign modulation waveform takes the place of the gradient field. One non-limiting example process for using the Shinar-Le Roux pulse sequence design algorithm is described in W. A. Grissom, Z. Cao, and M. D. Does. B1+-selective excitation pulse design using the Shinnar-Le Roux algorithm. J Magn Reson, 242:189-196, 2014 and U.S. Pat. No. 9,995,808, each of which is incorporated herein in its entirety for all purposes. In addition, a Hadamard beta filter design may be utilized, such as described by C. H. Cunningham and M. L. Wood. Method for improved multiband excitation profiles using the Shinnar-Le Roux transform. Magn Reson Med, 42(3):577-584, September 1999, which is incorporated herein by reference in its entirety for all purposes.

As one, non-limiting example, to design a set of N-bands B1-selective pulses using a Shinnar-Le Roux algorithm may be used to design the pulses of the pulse sequence. In particular, when using Shinnar Le Roux algorithm to design a set of N-bands B1-selective pulses, each of the N-bands B1-selective pulses applies a different phase pattern across the sub-bands. For example, one non-limiting example of a phase pattern may include +1/−1's according to a Hadamard basis. The amplitude waveform may be constant or may be modulated.

Thus, in some applications, a given pulse may be designed as a constant amplitude modulation (AM) waveform that is then tan h-modulated. Additionally or alternatively, a given pulse may be designed as a frequency modulated (FM) waveform, whereby the excitation can be modified with a variable-rate selective excitation (VERSE) onto the modulated AM waveform, which can be advantageous to mitigate distortions, for example, due to limited amplifier bandwidth.

At process block 207, an MRF pulse sequence may be created. That is, an MRF pulse sequence, such as may not be designed with consideration for any lack of B0 gradient magnet system for spatial encoding, may be selected or designed. Then, at process block 208, the spatially-distributed pulse sequence crated at step 206 and the MRF pulse sequence created at step 207 may be used to create a spatially-distributed MRF pulse sequence. In one non-limiting example, the spatially-distributed pulse sequence crated at step 206 and the MRF pulse sequence created at step 207 may be combined to create the spatially-distributed MRF pulse sequence. As one example, a Kronecker product may be used. In this case, this set of pulses are subjected to a Kronecker product with the different modes of the parallel transmit array, and the MRF sequence is likewise subjected to a Kronecker product to create a spatially-distributed MRF pulse sequence that produces signals across both tissue parameter and spatial dimensions in a manner that can be resolved during reconstruction. For example, the spatially-distributed MRF pulse sequence may be designed to produce signal evolutions with low or no coherence/correlation across both tissue parameters and spatial dimensions.

The present disclosure recognizes that other phase patterns and combined flip-angle-and-phase patterns might be advantageous. Thus, instead of B1-selective pulses, hard pulses with different power levels can be used to achieve a patterns of signal sign inversions. Also, B1-selective Bloch Siegert pulses can be used, but they can be filed separately. Overall, the present disclosure recognizes that a variety of different sequence parameters can be utilized in the design of the spatially-distributed MRF pulse sequence, such as pulses amplitude, flip angles, array modes, phases, echo time, repetition time, and others. Regardless of the parameters that are varied and how they these are varied spatially to achieve tissue and spatial incoherence (or low coherence), optionally, the pulse sequence can be evaluated at step 210 to ensure that the spatially-distributed MRF pulse sequence yields signal evolutions where the different spatial locations and tissue parameters can be separated.

At step 212, the pulse sequence designed at step 202 is performed using the varied acquisition parameters selected at step 210 to acquire MRF data from the resulting MRF signal evolutions. The MRF data is then processed at step 214 to resolve the tissue parameters and spatial information. For example, as described above, step 214 may include comparing the acquired MRF signal evolutions to a dictionary, or resolving the signal evolutions through an optimization process, such as via an analytical algorithm, which may or may not include machine learning or artificial intelligence. Then, at step 216, a report is generated that includes characterization of the subject being studied. For example, the report may be a quantitative map of constituent materials in the subject, such as a quantitative map of spin species. Additionally or alternatively, the report may include an image of the subject, such as an anatomical image of the subject.

Figure 3:
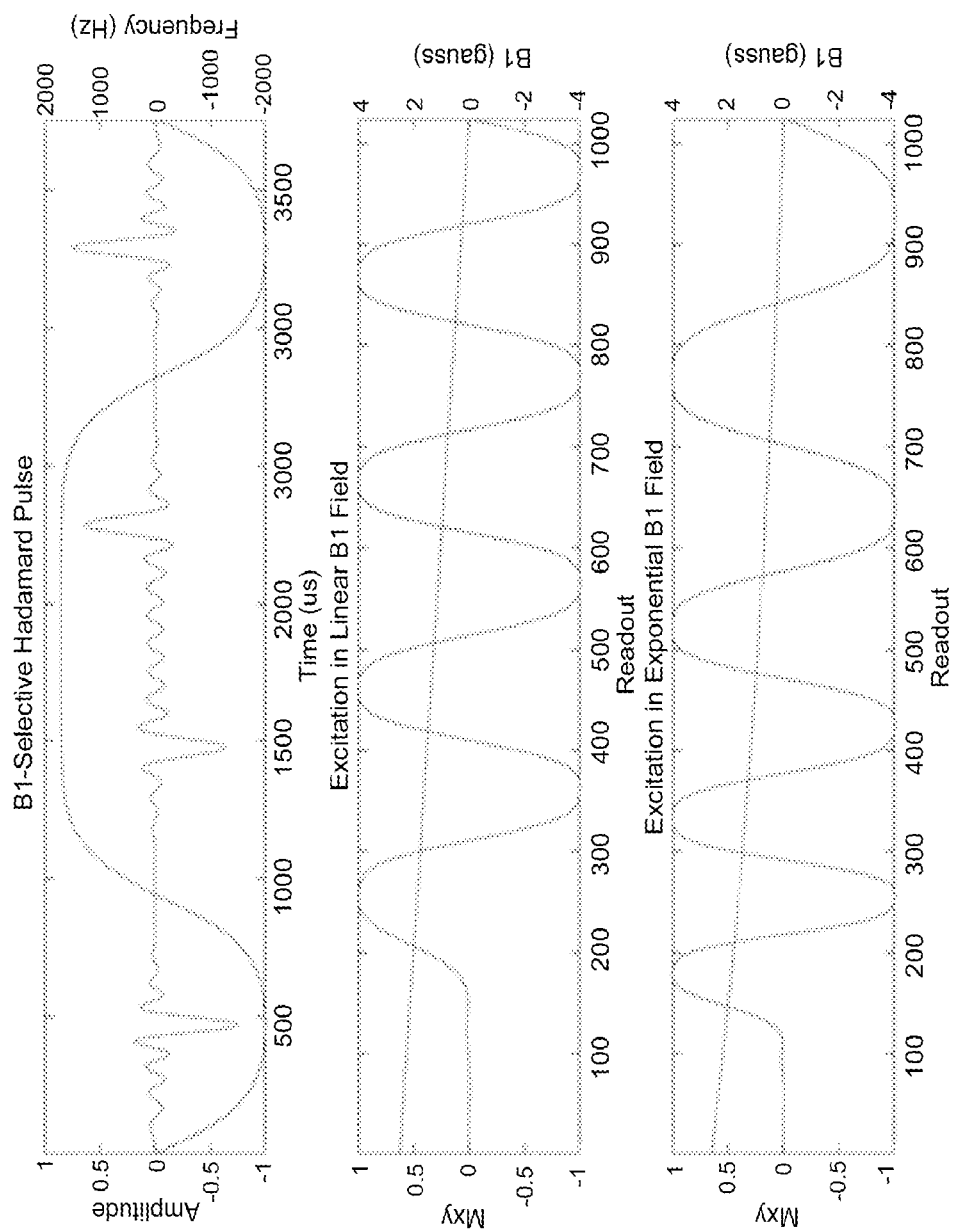
FIG. 3 is a set of graphs showing waveforms and excitation patterns for one non-limiting example of a pulse sequence designed and implemented in accordance with the present disclosure.

Referring to FIG. 3, one non-limiting example of plots of a pulse sequence designed in accordance with the present disclosure is provided. In the non-limiting example, the pulse sequence was designed for encoding 8 sub-slices, and the Mx profile was designed to excite as a function of B1+. Thus, FIG. 3 provides waveforms and excitation patterns for one of 8 Hadamard-encoding B1 selective pulses for encoding 8 sub-slices. The pulse was designed with uniform amplitude waveform, then that was tan h-modulated to control (e.g., minimize) amplifier distortions, and the frequency waveform was VERSE'd onto the modulated amplitude waveform. The middle row plots the pulse's Mx profile on a linear B1+ axis, which produces alternating pi phase between sub-slices. The bottom row plots the same profile on an exponentially decaying B1+ axis commensurate with a surface coil positioned on the left, which shows how the slice width increases further away from the coil, in a pattern similar to a barcode. Even beyond the non-limiting example illustrated in FIG. 3, the present disclosure recognizes that the B1-selective pulse may be an RF pulse with a flip angle greater than 90 degrees that is applied anywhere within the imaged volume.

The present disclosure recognizes that a general class of RF pulses may be used to still achieve the desired encoding, at the expense of a much more complicated reconstruction process, such as the hard pulses described above. If hard pulses are used and the power levels of the pulses are scaled, a relatively simple sequence is achieved, which can spatially encode the signal evolutions that are acquired by producing an alternating pattern of inversions in the magnetization when moving through space. Though pulse design is relatively straightforward, the reconstruction is more complicated because the magnetization dynamics are more complicated due to the need to resolve the signals being actually inverted or not inverted. That is, use of such hard pulses and spatial incoherence being achieved by inversions, results in a reconstruction that is more complicated than using B1-selective pulses where all the magnetization gets the same flip angle and the phase is varied across space. Also, with the hard pulses, the dictionary matching can require finely spatially resolved entries because the signal evolutions can vary quite rapidly based on the inversion pattern. On the other hand, the B1 amplitude gradient can be comparatively large, so rapid that multiple inversions can be used across a single voxel. One non-limiting example for MRF pulse design is provided in U.S. Pat. No. 10,614,359, which is incorporated herein in its entirety for all purposes.

Example

In one non-limiting example, a simulation was performed using the B1+/B1− maps of eight 15 cm-radius loops positioned circumferentially around a circular ROI. The maps were calculated by Biot-Savart, and the B1+ maps were scaled to 0-10 Gauss inside the ROI. Then a set of 64 coil modes were defined, including individual coils and sums and differences of three and four coils. A set of 32 B1+-selective Hadamard encoding excitation pulses (duration 3.8 ms) were designed to excite a slab between 0-8 Gauss with 32 sub-slices. A second set was designed with a half-slice shift, for a total of 64 pulses. This 64×64=4096 set of excitations were then used in an MRF Bloch simulation (TR=4 ms, 2.5 cycles sinusoidal flip angle variation up to 90 degrees, inversion prep) to generate a dictionary of signal time courses at each spatial location for white matter (WM; T1/T2=700/60 ms), grey matter (GM; T1/T2=1000/100 ms), and cerebrospinal fluid (CSF; T1/T2=1800/400 ms), as well as three confounding signals with T1/T2=400/30, 1300/100, and 1700/490 ms. Brain WM, GM, and CSF masks and random noise were then used to generate signals for each receiver coil, and reconstruction was performed by dictionary matrix inverse.

Figure 4:
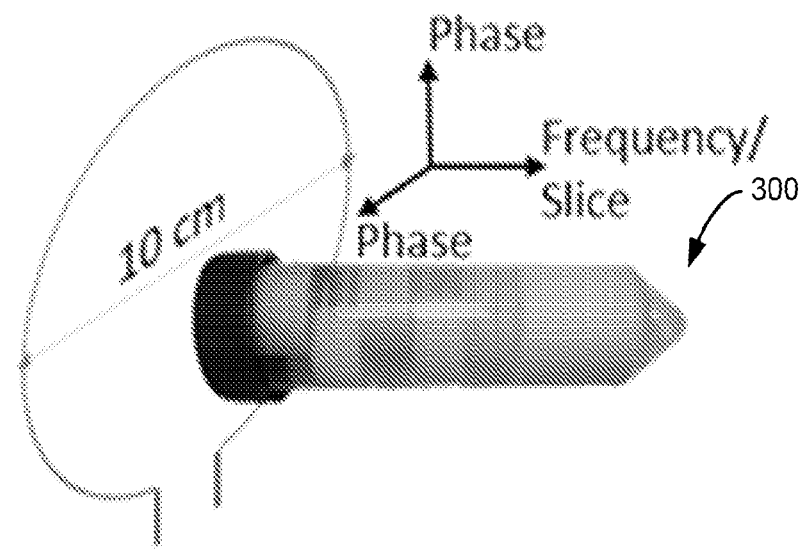
FIG. 4 shows one example configuration of an experimental setup and correlated images.
Figure 4:
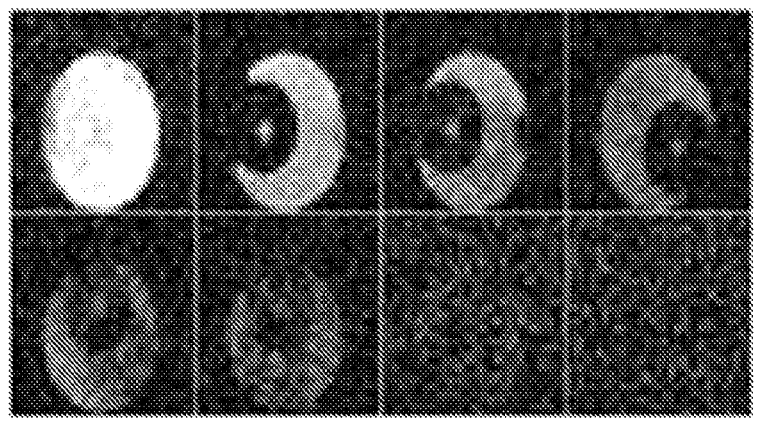
Figure 4:
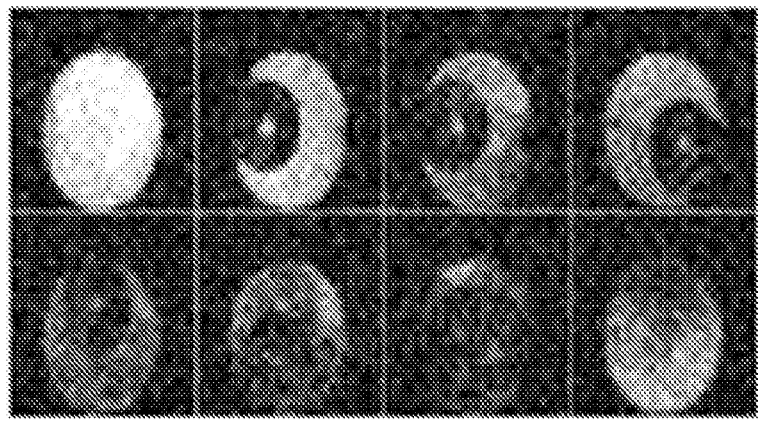

To validate the B1+-selective Hadamard encoding pulses, a set of pulses were designed for 8 sub slices, as illustrated in FIG. 3, to encode the long axis of a 10 cm-long mineral oil test tube phantom 300, as illustrated in FIG. 4, containing stacked circular disks at different radial positions. The sub slices were 0.25 gauss in width and spaced evenly between 0 and 2 Gauss. Data were acquired using a Tecmag Redstone MRI Console (Tecmag, Houston, Texas) with a single-turn 10 cm loop TR coil on a 47.5 mT whole-body permanent magnet.

A 3D gradient-recalled echo sequence with a 10 us hard pulse excitation was used to acquire reference images with parameters: TR=75 ms, TE=26 ms, Readout Bandwidth=5 kHz, 128 readout points, and 31 by 31 phase encodes. This 3D scan was repeated using each Hadamard pulse for excitation, and the DC data were used to reconstruct the Hadamard-encoded images. A reference test tube phantom 300 without structure was also excited with each Hadamard pulse to measure a calibrated reconstruction matrix.

Figure 5:
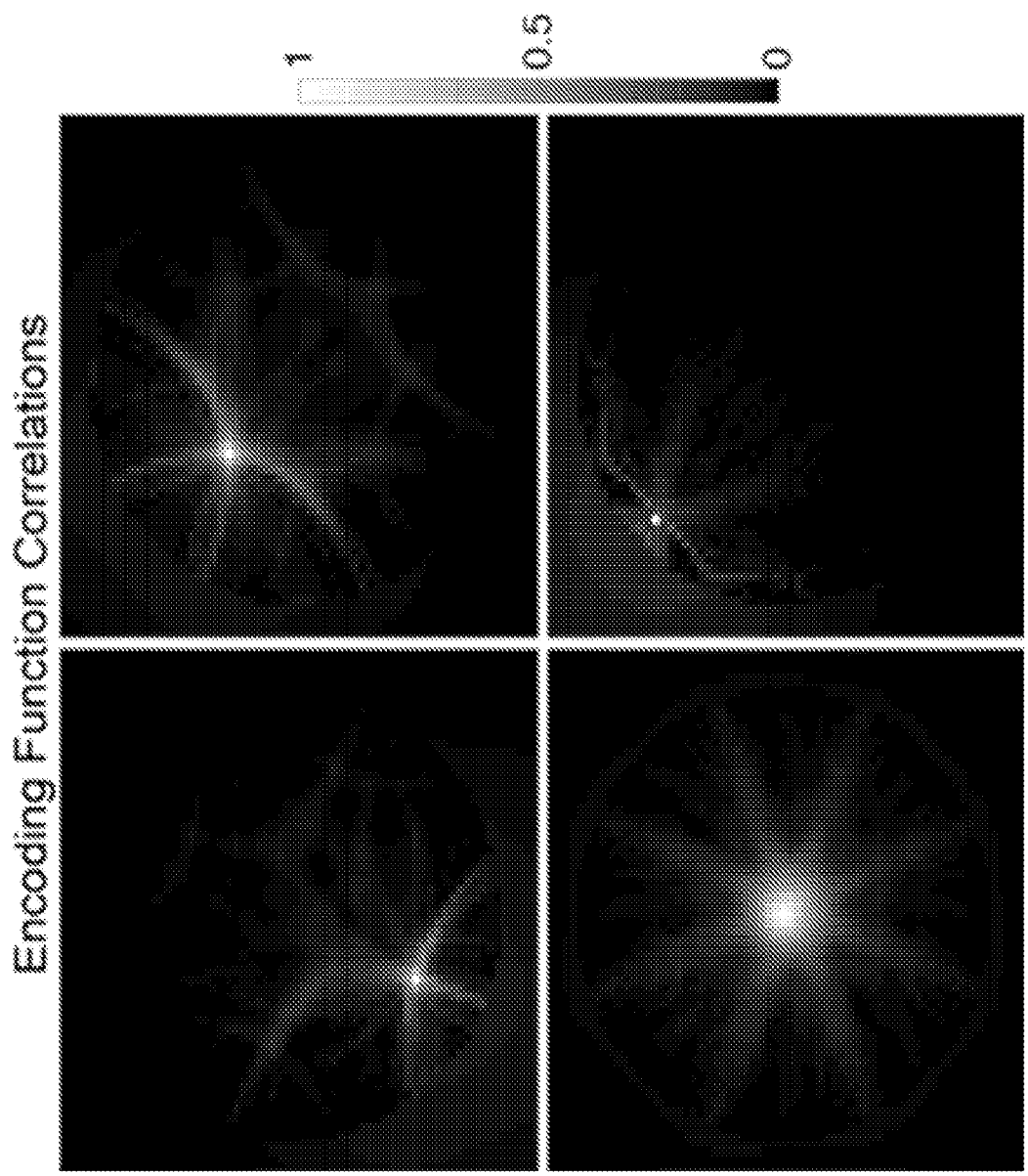
FIG. 5 is a set of encoding function correlation maps for four voxels acquired using the non-limiting example implementation.
Figure 6B:
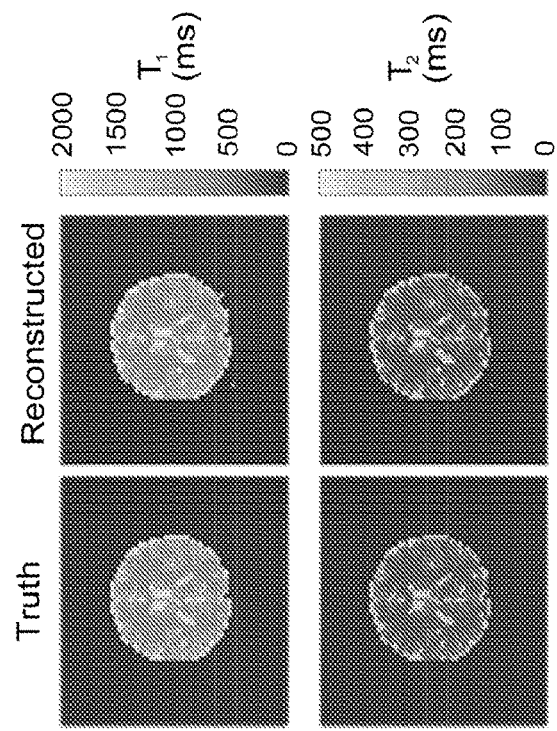
FIG. 6B is a set of true versus reconstructed combined T1 and T2 maps acquired and reconstructed in accordance with the systems and methods of the present disclosure.
Figure 6A:
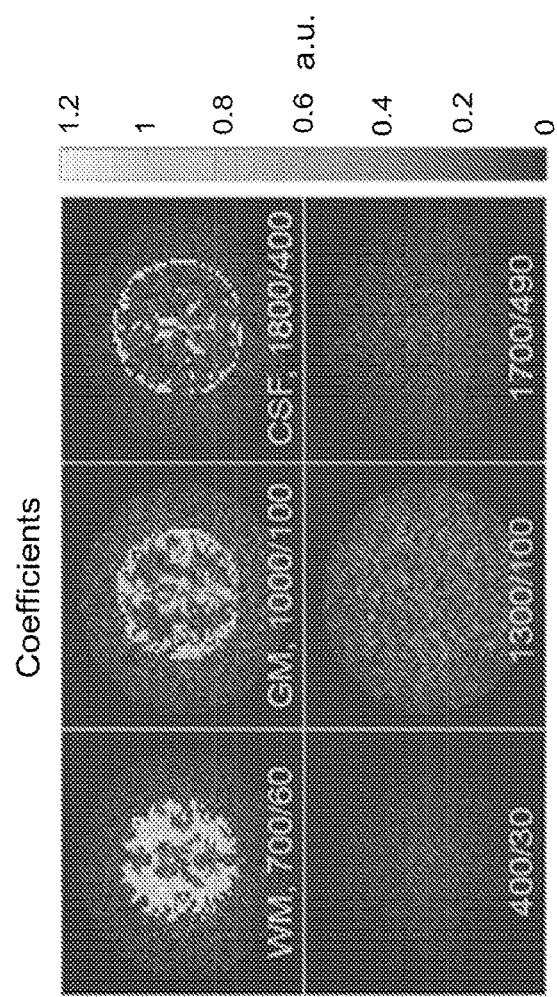
FIG. 6A is a set of coefficient maps acquired and reconstructed in accordance with the systems and methods of the present disclosure.

Excitation patterns produced by each encoding pulse and mode were tracked. The patterns produce 0/pi phase oscillations over the excited slabs, with varying sub-slice widths, positions, and curvatures. FIG. 5 shows signal correlation maps for four voxels at different radial and angular positions in the circular ROI, which reflect fine encoding resolution near the coils, where the B1+ fields change the fastest and the B1-fields overlap the least. Resolution in the middle can be improved by increasing the number of excited sub-slices or adding excitations with sub-slice shifts. More particularly, encoding function correlation maps for four voxels are shown. Correlations were calculated as the inner products between each source voxel's weights across encoding functions and every other voxel's weights. The source voxels in the top row are approximately halfway between the middle and edge of the ROI, the source voxel in the bottom left is centered, and the source voxel in the bottom right is almost at the edge of the ROI. The encoded resolution is finest near the transmit coils, and becomes broader in the middle FIGS. 6A and 6B shows reconstructed coefficient and T1/T2 maps from the data acquired using the above-described process. Only one voxel inside the brain was misclassified. In particular, FIG. 6A shows reconstructed coefficient maps for each T1/T2 pair included in the reconstruction dictionary. The T1 and T2 are reported for each map, in ms. The reconstruction successfully identified the true values for each tissue type. FIG. 6B provides true versus reconstructed combined T1 and T2 maps. The combined maps were obtained by finding the maximum reconstructed coefficient across T1/T2 pairs at each voxel.

An encoding pulse validation experiment was performed. The phantom 300 and coil setup for is that illustrated in FIG. 4. The top row of associated images shows the hard pulse-excitation images that were obtained by summing images through the Hadamard-encoded slice widths. The lower row shows the Hadamard-encoded images, which agree with the hard pulse images and have higher signal at deeper slices due to the uniform flip angles excited by the B1+-selective pulse.

The above-described techniques, which may be referred to as "MR barcoding" provides a new encoding technique based on non-linear RF magnitude gradients synthesized by an array of conventional transmit coils, combined with B1+-selective Hadamard encoding pulses. Since it does not use B0 gradients, it is silent, compared to traditional B0 gradient coil system. It has low RFPA bandwidth requirements, so it can be implemented with low-cost, on-coil amplifiers, such as described in N. Gudino, J. A. Heilman, M. J. Rife, O. Heid, M. Vester, and M. A. Griswold. On-coil multiple channel transmit system based on class-D amplification and pre-amplification with current amplitude feedback. Magn Reson Med, 70(1):276-289, 2013, which is incorporated herein by reference in its entirety.

The above-described systems and methods can be applied to achieve large cost reductions in very-low field systems, or to enable much larger (~1 m-wide) bores at high field strengths for the static magnetic field (B0 field). A proof-of-principle simulation showed that a 64×64 image could be reconstructed using an MRF model and a sub-30s scan duration. Experimental results validated the encoding capabilities of the B1+-selective Hadamard encoding pulses.

The present invention has been described in terms of some preferred embodiments, and it should be appreciated that equivalents, alternatives, variations, and modifications, aside from those expressly stated, are possible and within the scope of the invention.

The invention claimed is:

1. A method for using a nuclear magnetic resonance (NMR) system, the method including steps comprising:
performing a pulse sequence using the NMR system that spatially encodes NMR signal evolutions to be acquired from a subject using an aggregated radio-frequency (B1) field incoherence;
resolving the NMR signal evolutions acquired from the subject using at least one of a dictionary of known magnetic resonance fingerprinting (MRF) signal evolutions to determine matches in the NMR signal evolutions to the known MRF signal evolutions or an optimization process; and
generating at least two spatially-resolved measurements indicating quantitative tissue parameters of the subject in at least two locations.

2. The method of claim 1, wherein performing the pulse sequence further comprises performing parallel transmission RF excitation using an RF system of the NMR system.

3. The method of claim 1, wherein the aggregated B1 incoherence is generated using one or more coils in an array, and wherein individual elements of the array are driven with respective pulse phases or amplitudes to generate respective array modes that generate a plurality of spatially-distinct B1 profiles that extend across at least a portion of the subject.

4. The method of claim 3, further comprising applying an RF pulse to any location within an imaging volume including the subject.

5. The method of claim 1, wherein performing the pulse sequence includes using non-linear radio-frequency (RF) magnitude gradients synthesized by an array of conventional transmit coils, combined with B1+-selective encoding pulses to spatially encode the NMR signal evolutions.

6. The method of claim 1, further comprising designing the pulse sequence by selection of a frequency modulation for an RF pulse and then selecting amplitude and sign modulation to spatially encode the NMR signal evolutions acquired using the RF pulse.

7. The method of claim 6, wherein the RF pulse is designed to be a constant amplitude modulation waveform that is then tanh-modulated.

8. The method of claim 6, wherein the RF pulse is designed to be a frequency modulation waveform that is transformed into an amplitude modulation waveform using a variable-rate selective excitation (VERSE) to control distortions due to limited amplifier bandwidth.

9. The method of claim 1, further comprising generating at least one of an image of the subject or a map of tissue parameters using the NMR signal evolutions and the at least two spatially-resolved measurements.

10. A magnetic resonance imaging (MRI) system comprising:
a magnet system configured to generate a polarizing magnetic field about a portion of the subject positioned in the MRI system;
a radio frequency (RF) system configured to apply a RF excitation field to the subject, and acquire therefrom a set of magnetic resonance image (MM) data;
at least one processor configured to:
control the RF system to perform a pulse sequence that spatially encodes MRI signal evolutions to be acquired from an imaging volume in a subject using a radio-frequency (B1) field without using coils configured to apply a gradient field to the polarizing magnetic field;
resolve the MRI signal evolutions acquired from the subject using at least one of a dictionary of known magnetic resonance fingerprinting (MRF) signal evolutions to determine matches in the MRI signal evolutions to the known MRF signal evolutions or an optimization to determine tissue parameters and spatial resolution from the MRI signal evolutions; and
generate a report indicating quantitative parameters of the subject in at least two spatially-resolved locations forming a map.

11. The system of claim 10, wherein the RF system includes one or more coils in an array, and wherein individual elements of the array are driven with respective pulse phases or amplitudes to generate respective array modes that generate a plurality of B1 profiles across the subject.

12. The system of claim 11, wherein the at least one processor is configured to apply RF pulse to any location within the imaging volume.

13. The system of claim 10, wherein the at least one processor is further configured to design the pulse sequence to include non-linear radio-frequency (RF) magnitude gradients synthesized by an array of conventional transmit coils, combined with B1+-selective encoding pulses to spatially encode the NMR signal evolutions.

14. The system of claim 10, wherein the at least one processor is further configured to design the pulse sequence by selecting a frequency modulation for an RF pulse and then selecting amplitude and sign modulation to spatially encode the NMR signal evolutions acquired using the RF pulse.

15. The system of claim 14, wherein the at least one processor is further configured to design the RF pulse to be a constant amplitude modulation waveform that is then tanh-modulated.

16. The system of claim 15, wherein the at least one processor is further configured to design the RF pulse to be a frequency modulation waveform that is transformed into an amplitude modulation waveform using a variable-rate selective excitation (VERSE) to control distortions due to limited amplifier bandwidth.

17. A method for generating images or maps of a subject using a nuclear magnetic resonance (NMR) system, the method including steps comprising:

performing a pulse sequence only using a radio-frequency (B1) field that excites NMR signal evolutions that are spatially incoherent and tissue-parameter incoherent;

acquiring the NMR signal evolutions that are that are spatially incoherent and tissue-parameter incoherent from the subject;

resolving the NMR signal evolutions using at least one of a dictionary of known magnetic resonance fingerprinting (MRF) signal evolutions to determine matches in the NMR signal evolutions to the known MRF signal evolutions or an optimization process to generate resolved tissue parameters and spatially-resolved signal evolutions; and generating at least one of an image or a spatially-resolved map indicating the tissue parameters of the subject in at least two locations using the resolved tissue parameters and spatially-resolved signal evolutions.

18. The method of claim 17, wherein performing the pulse sequence further comprises performing parallel transmission RF excitation using an RF system of the NMR system.

19. The method of claim 17, wherein performing the pulse sequence further comprises performing a pattern of inversions configured to excite the NMR signal evolutions that are spatially incoherent.

20. The method of claim 17, wherein the B1 field is generated using one or more coils in an array, and wherein individual elements of the array are driven with respective pulse phases or amplitudes to generate respective array modes that generate a plurality of B1 profiles across the subject.

21. The method of claim 17, wherein the B1 field is inhomogeneous in at least one of phase or amplitude to excite the NMR signal evolutions that are spatially incoherent.

22. The method of claim 17, wherein the optimization process includes applying a neural network to perform the optimization.

\* \* \* \* \*

UNITED STATES PATENT AND TRADEMARK OFFICE
CERTIFICATE OF CORRECTION

| | |
|---|---|
| PATENT NO. | : 11,841,413 B2 |
| APPLICATION NO. | : 17/758138 |
| DATED | : December 12, 2023 |
| INVENTOR(S) | : Mark A. Griswold and William A. Grissom |

It is certified that error appears in the above-identified patent and that said Letters Patent is hereby corrected as shown below:

In the Claims

Claim 10, Column 14, Line 36, "set of magnetic resonance image (MM) data;" should be -- set of magnetic resonance image (MRI) data; --

Claim 17, Column 15, Line 23, "acquiring the NMR signal evolutions that are that are" should be -- acquiring the NMR signal evolutions that are --

Signed and Sealed this
Twenty-third Day of April, 2024

Katherine Kelly Vidal
*Director of the United States Patent and Trademark Office*